(12) United States Patent
Radousky et al.

(10) Patent No.: US 10,298,152 B2
(45) Date of Patent: May 21, 2019

(54) HARVESTING MECHANICAL AND THERMAL ENERGY BY COMBINING NANOWIRES AND PHASE CHANGE MATERIALS

(71) Applicant: Lawrence Livermore National Security, LLC, Livermore, CA (US)

(72) Inventors: Harry B. Radousky, San Leandro, CA (US); Fang Qian, Santa Cruz, CA (US); Yinmin Wang, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 471 days.

(21) Appl. No.: 15/133,764

(22) Filed: Apr. 20, 2016

(65) Prior Publication Data

US 2016/0308468 A1    Oct. 20, 2016

Related U.S. Application Data

(60) Provisional application No. 62/149,901, filed on Apr. 20, 2015.

(51) Int. Cl.
*H02N 2/18* (2006.01)
*F03G 7/06* (2006.01)
*H01L 41/113* (2006.01)
*H02N 2/00* (2006.01)

(52) U.S. Cl.
CPC ............... *H02N 2/18* (2013.01); *F03G 7/065* (2013.01); *H01L 41/113* (2013.01)

(58) Field of Classification Search
CPC ........ H02N 2/18; H02N 10/00; H01L 41/113; H01L 41/082; F03G 7/065; F03G 7/06
See application file for complete search history.

(56) References Cited

U.S. PATENT DOCUMENTS 5,188,286 A * 2/1993 Pence, IV ........ G05D 23/27535
236/1 F
5,550,387 A   8/1996 Elsner et al.
(Continued)

FOREIGN PATENT DOCUMENTS

WO    WO-2011050307 A2 *  4/2011  ........... G01N 27/327

OTHER PUBLICATIONS

Chen, Xi et al. "1.6 V Nanogenerator for Mechanical Energy Harvesting Using PZT Nanofibers," Nano Letters. May 25, 2010; 10(6), pp. 2133-2137.
(Continued)

*Primary Examiner* — Edgardo San Martin
(74) *Attorney, Agent, or Firm* — Harness, Dickey & Pierce, PLC

(57) ABSTRACT

A system is disclosed for harvesting at least one of mechanical or thermal energy. The system may have a flexible substrate, a plurality of electrically conductive nanowires secured to the substrate, and a plurality of electrically conductive metal layers. The metal layers may be disposed on the substrate and spaced apart from one another along a length of the substrate. The metal layers may be in electrically conductive contact with various ones of the nanowires. At least two of the metal layers may be attachable to an external device. At least one of movement or flexing of the substrate produces an output voltage across the metal layers.

21 Claims, 5 Drawing Sheets

(56) References Cited

U.S. PATENT DOCUMENTS

| | | | | |
|---|---|---|---|---|
| 6,750,596 B2* | 6/2004 | Kim | ........................ | H02K 35/02 310/339 |
| 6,906,003 B2* | 6/2005 | Struthers | ................ | B82Y 30/00 429/100 |
| 7,329,959 B2* | 2/2008 | Kim | ........................ | B81B 3/0024 290/1 R |
| 7,397,169 B2 | 7/2008 | Nersessian et al. | | |
| 7,898,156 B2* | 3/2011 | Wang | ........................ | H02N 2/18 310/339 |
| 8,344,597 B2* | 1/2013 | Sirbuly | .................... | B82Y 30/00 136/205 |
| 8,354,776 B2* | 1/2013 | Choi | ........................ | H02N 2/18 310/338 |
| 8,623,451 B2* | 1/2014 | Wang | ........................ | H02N 2/18 29/25.35 |
| 8,692,104 B2* | 4/2014 | Asatani | .................... | H01L 35/32 136/205 |
| 8,778,563 B2* | 7/2014 | Wang | .................... | G01N 27/327 429/523 |
| 8,785,914 B2* | 7/2014 | Choi | ........................ | B82Y 10/00 257/40 |
| 9,052,283 B2* | 6/2015 | Wang | ........................ | G01N 27/327 |
| 9,236,669 B2* | 1/2016 | Mann | ........................ | H01B 1/24 |
| 9,270,207 B2* | 2/2016 | Sohn | ........................ | H01L 41/45 |
| 9,537,157 B2* | 1/2017 | Wang | .................... | G01N 27/327 |
| 9,746,955 B2* | 8/2017 | Kim | ........................ | G06F 3/047 |
| 9,947,718 B2* | 4/2018 | Schneider | ............ | A43B 3/0005 |
| 9,953,202 B2* | 4/2018 | Khalid | ................ | G06K 9/0002 |
| 9,980,394 B2* | 5/2018 | Stay | ........................ | G06F 3/041 |
| 2004/0238022 A1 | 12/2004 | Hiller et al. | | |
| 2005/0118494 A1* | 6/2005 | Choi | ........................ | B82Y 30/00 429/401 |
| 2009/0056094 A1* | 3/2009 | Shi | ........................ | H01L 41/1876 29/25.35 |
| 2011/0107569 A1* | 5/2011 | Wang | ........................ | H02N 2/18 29/25.35 |
| 2012/0276327 A1* | 11/2012 | Cola | ........................ | B01J 23/745 428/119 |
| 2012/0293047 A1* | 11/2012 | Wang | ........................ | H01L 27/20 310/339 |
| 2013/0098417 A1* | 4/2013 | Gavillet | .............. | H01L 23/4275 136/200 |
| 2014/0174496 A1* | 6/2014 | Park | ........................ | H01L 35/325 136/224 |
| 2015/0179922 A1* | 6/2015 | Kim | ........................ | H01L 41/113 310/339 |
| 2016/0155930 A1* | 6/2016 | Sohn | ........................ | H01L 41/45 29/25.35 |
| 2017/0317261 A1* | 11/2017 | Ozturk | .................... | H01L 35/32 |

OTHER PUBLICATIONS

Qin, Yong et al. Microfibre-Nanowire Hybrid Structure for Energy Scavenging. Nature, 451(7180), Feb. 14, 2008, pp. 809-813.

Wang, Zhong et al. "Piezoelectric Nanogenerators Based on Zinc Oxide Nanowire Arrays," Science. Apr. 14, 2006, 312(5771), pp. 242-246.

Xu, Chen et al. "Compact Hybrid Cell Based on a Convoluted Nanowire Structure for Harvesting Solar and Mechanical Energy," Advanced Materials, Feb. 2011 23(7), pp. 873-877.

Xu, Sheng et al. "Self-powered nanowire devices," Nature Nanotechnology, May 1, 2010, 5(5), pp. 366-373.

Xu, Sheng et al. "Piezoelectric-Nanowire-Enabled Power Source for Driving Wireless Microelectronics," Nature Communications. Oct. 19, 2010, pp. 1-5.

Ko, Seung et al. "Nanoforest of Hydrothermalloy Grown Hierarchical ZnO Nanowires for A High Efficiency Dye-Sensitized Solar Cell," Nano Letters. Jan. 5, 2011; 11(2), pp. 666-671.

Song, Jinshui et al. "Piezoelectric and Semiconducting Coupled Power Generating Process of a Single ZnO Belt/Wire. A Technology for Harvesting Electricity From the Environment," Nano Letters. Aug. 9, 2006, 6(8), pp. 1656-1662.

Zhu, Guang et al. "Flexible High-Output Nanogenerator Based on Lateral ZnO Nanowire Array," Nano Letters. Jul. 21, 2010, 10(8), pp. 3151-3155.

Yang, Ya et al. "Flexible Hybrid Energy Cell for Simultaneously Harvesting Thermal, Mechanical, and Solar Energie," ACS Nano. Dec. 5, 2012, 7(1), pp. 785-790.

* cited by examiner

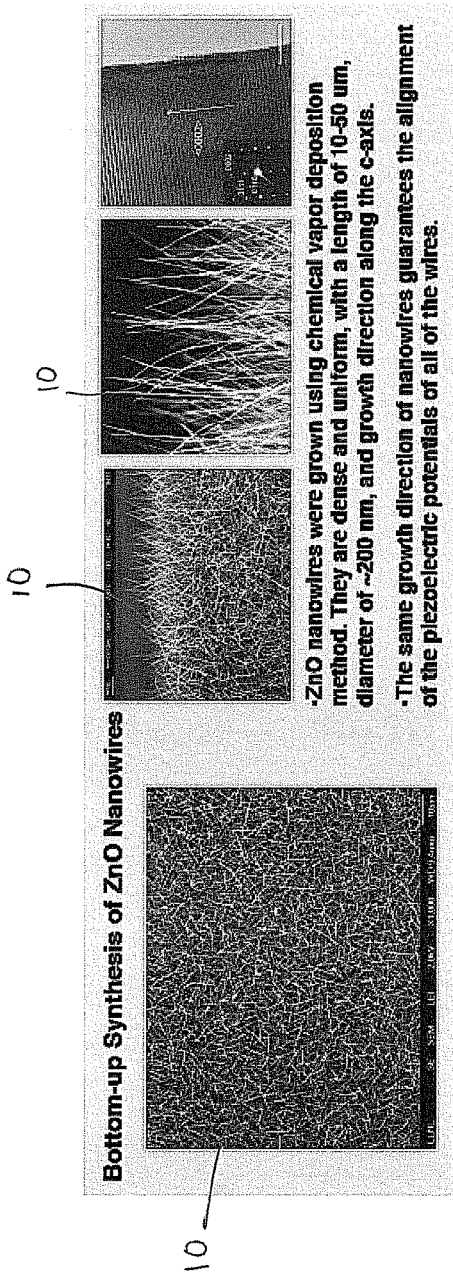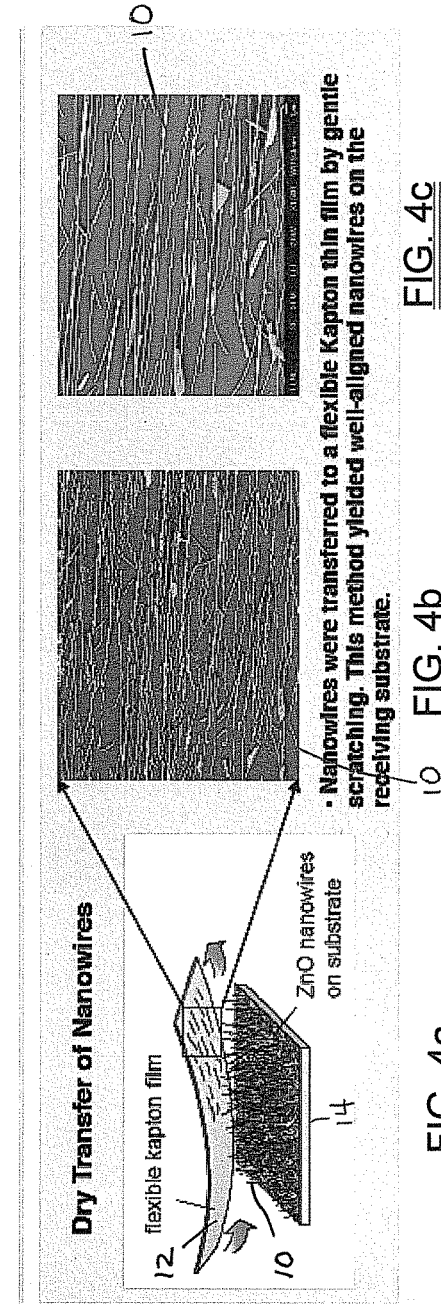

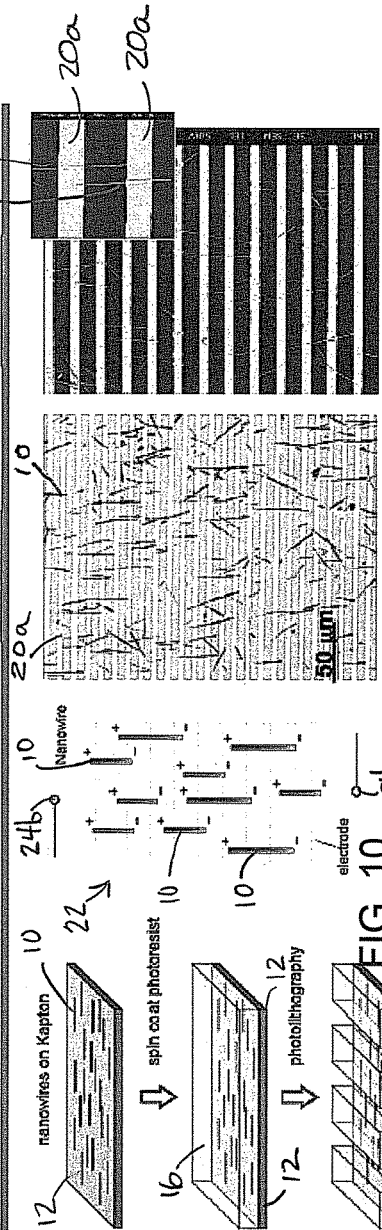
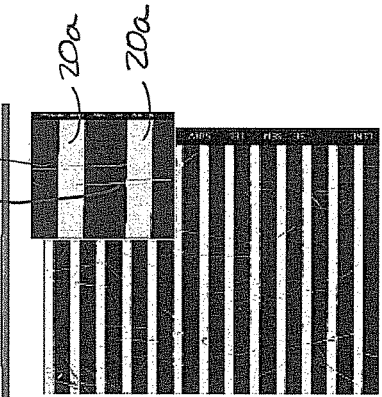
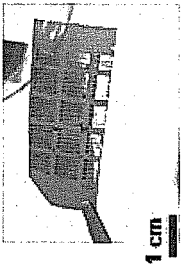
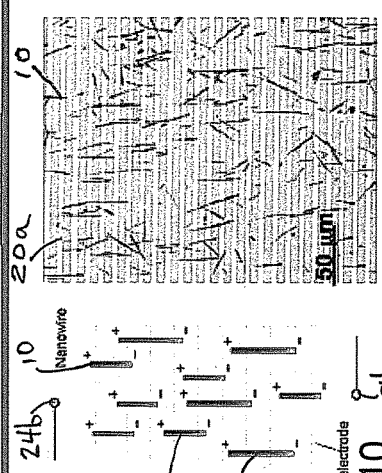
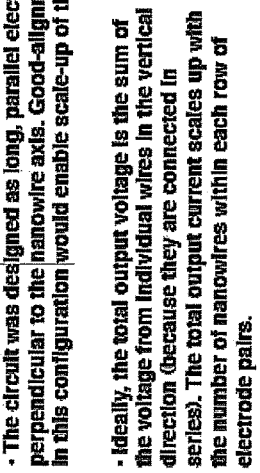
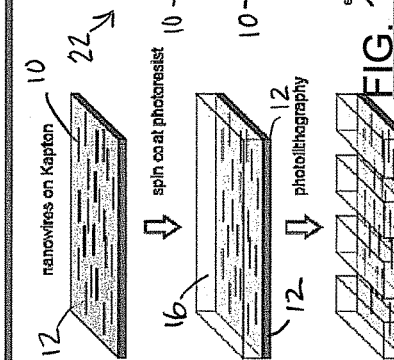
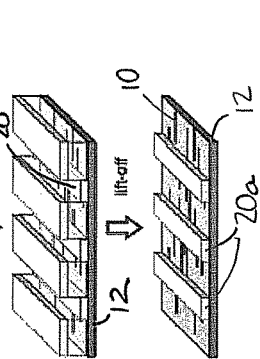

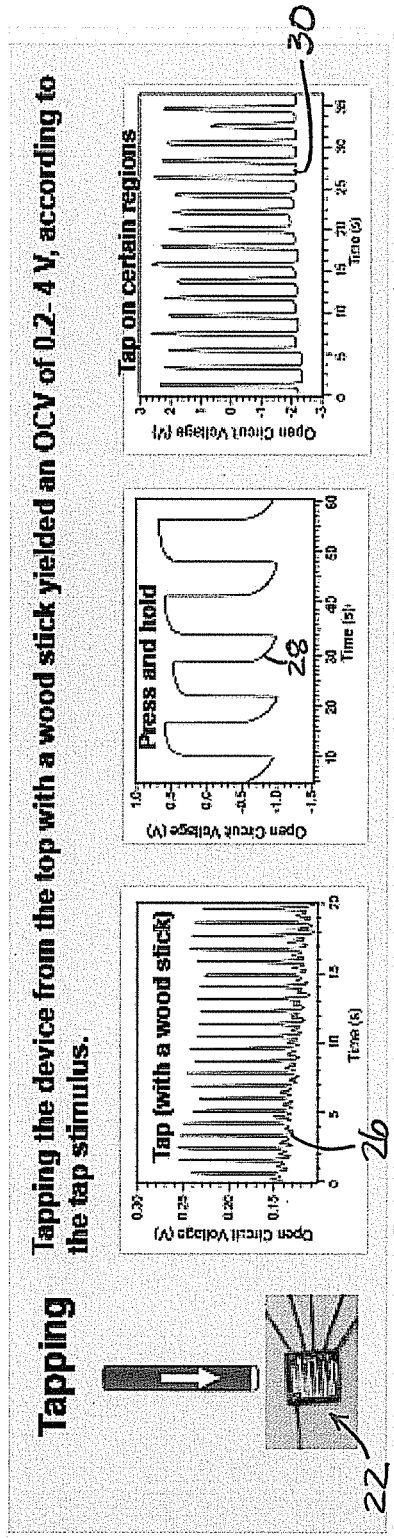

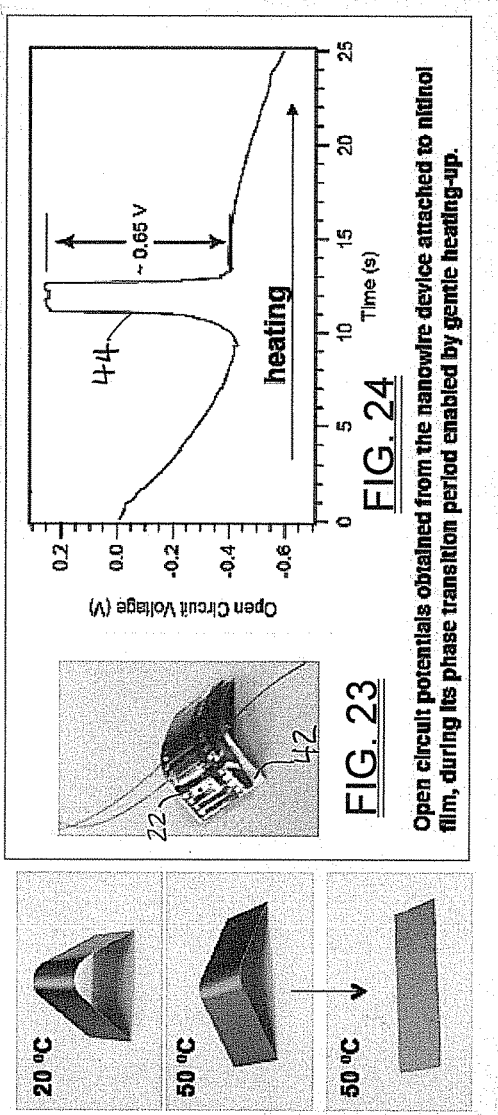

HARVESTING MECHANICAL AND THERMAL ENERGY BY COMBINING NANOWIRES AND PHASE CHANGE MATERIALS

CROSS-REFERENCE TO RELATED APPLICATION

This application claims the benefit of U.S. Provisional Application No. 62/149,901, filed on Apr. 20, 2015. The entire disclosure of the above application is incorporated herein by reference.

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present application relates to energy harvesting systems and methods, and more particularly to systems and methods for harvesting mechanical and thermal energy by the use of nanowires and/or phase change materials.

BACKGROUND

This section provides background information related to the present disclosure which is not necessarily prior art.

U.S. Pat. No. 7,397,169 by Nersesse Nersessian, Gregory P. Carman, and Harry B. Radousky for energy harvesting using a thermoelectric material includes the state of technology information reproduced below.

Waste heat is always generated whenever work is done. Harvesting such waste heat can increase the efficiency of engines, be used to power numerous devices (eliminating the need for auxiliary power sources), and in general, significantly reduce power requirements. Various methods have been used to try and harvest such waste heat and mechanical energy. For waste heat the most important of which is through thermoelectric materials. In order to efficiently convert waste heat to usable electrical energy, thermoelectric materials generally requires a large Seebeck coefficient having a "figure of merit" or Z, defined as, $$Z = \frac{s^2 \sigma}{k}$$

where S is the thermoelectric power, i.e., the Seebeck coefficient, $\sigma$ is the electrical conductivity (=1/$\rho$), $\sigma$ is the electrical resistivity and k is the thermal conductivity and. A dimensionless number ZT is often used as a figure of merit for the TE material. For conventional materials the ZT<1 at T=300 K. The higher the ZT, the more efficient the TE. $\rho$ is the electrical resistivity, and K is the thermal conductivity. The Seebeck coefficient is further defined as the ratio of the open-circuit voltage to the temperature difference ($\delta T$) between the hot and cold junctions of a circuit exhibiting the Seebeck effect, or S=V/($\delta T$). Therefore, in searching for a good thermoelectric material, materials with large values of S, and low values of p and k are beneficial.

However, current state of the art thermoelectric materials utilized to harvest waste heat and convert such heat to a useful energy, for example, devices that use a combination of n-type and p-type materials, generally have Z values which are prohibitively low for harvesting energy from low quality waste heat, where $\delta T$ is on the order of 100° C. or less.

Additional background information on thermoelectric devices is described in U.S. Pat. No. 5,550,387, entitled "Superlattice Quantum Well Material," issued Aug. 27, 1996 to Elsner et al. (hereinafter the "Elsner '387 patent"). The Elsner '387 patent involves thermoelectric elements having a very large number of alternating layers of semiconductor material. The alternating layers all have the same crystalline structure. This makes the vapor deposition process easy because the exact ratio of the materials in the layers is not critical. The Elsner '387 patent demonstrates that materials produced in accordance with the teachings thereof provide figures of merit more than six times that of prior art thermoelectric materials. A preferred embodiment discussed in the Elsner '387 patent is a superlattice of Si, as a barrier material, and SiGe, as a conducting material. Both of these materials have the same cubic structure. Another preferred embodiment which is discussed is a superlattice of B—C alloys, the layers of which would be different stoichiometric forms of B—C but in all cases the crystalline structure would be alpha rhombohedral. In a described preferred embodiment the layers are grown under conditions as to cause them to be strained at their operating temperature range in order to improve the thermoelectric properties.

Background information on an energy harvesting system is described and claimed in U.S. Pat. No. 2004/0238022 A1, entitled "Thermoelectric Power From Environmental Temperature Cycles," issued Dec. 2, 2004 to Hiller et al. (hereinafter the "Hiller '022 application"). The Hiller '022 application involves an electric generator system for producing electric power from the environmental temperature changes such as occur during a normal summer day on Earth or Mars. In a described preferred embodiment a phase-change mass is provided which partially or completely freezes during the relatively cold part of a cycle and partially or completely melts during the relatively hot part of the cycle. A thermoelectric module is positioned between the phase-change mass and the environment. The temperature of the phase-change mass remains relatively constant throughout the cycle. During the hot part of the cycle heat flows from the environment through the thermoelectric module into the phase change mass generating electric power which is stored in an electric power storage device such as a capacitor or battery. During the cold part of the cycle heat flows from the phase change mass back through the module and out to the environment also generating electric power that also is similarly stored. An electric circuit is provided with appropriate diodes to switch the direction of the current between the hot and cold parts of the cycle. A preferred phase change mass is a solution of water and ammonia that has freeze points between about 270° K to about 145° K depending on the water ammonia ratio. It is further described that, preferably, a finned unit is provided to efficiently transfer heat from a module surface to the environment.

Various attempts at using nanowires for mechanical energy harvesting have been made, with varying degrees of success. Information on mechanical energy harvesting may be found at: Chen X, Xu S, Yao N, Shi Y. "1.6 V Nanogenerator For Mechanical Energy Harvesting Using PZT Nanofibers," Nano Letters. 2010 May 25; 10(6), pp. 2133-7; Qin, Y., Wang, X. and Wang, Z. L. "Microfibre-Nanowire Hybrid Structure For Energy Scavenging. Nature, 451(7180), 2008 Feb. 14, pp. 809-813; Wang Z L, Song J. "Piezoelectric Nanogenerators Based On Zinc Oxide Nanowire Arrays," Science. 2006 Apr. 14, 312(5771), pp. 242-6; Xu C, Wang Z L. "Compact Hybrid Cell Based On A Convoluted Nanowire Structure For Harvesting Solar And Mechanical Energy," Advanced Materials, 2011 Feb. 15, 23(7), pp. 873-7; Xu S, Qin Y, Xu C, Wei Y, Yang R, Wang Z L. "Self-powered nanowire devices," Nature Nanotechnology, 2010 May 1, 5(5), pp. 366-73; Xu S, Hansen B J, Wang Z L. "Piezoelectric-Nanowire-Enabled Power Source For Driving Wireless Microelectronics," Nature Communications. 2010 Oct. 19, pp. 1-5; Ko S H, Lee D, Kang H W, Nam K H, Yeo J Y, Hong S J, Grigoropoulos C P, Sung H J. "Nanoforest Of Hydrothermally Grown Hierarchical ZnO Nanowires For A High Efficiency Dye-Sensitized Solar Cell," Nano Letters. 2011 Jan. 5; 11(2), pp. 666-71; Song J, Zhou J, Wang Z L. "Piezoelectric And Semiconducting Coupled Power Generating Process Of A Single ZnO Belt/ Wire. A Technology For Harvesting Electricity From The Environment," Nano Letters. 2006 Aug. 9, 6(8), pp. 1656-62; Zhu G, Yang R, Wang S, Wang Z L. "Flexible High-Output Nanogenerator Based On Lateral ZnO Nanowire Array," Nano Letters. 2010 Jul. 21, 10(8), pp. 3151-5; Yang Y, Zhang H, Zhu G, Lee S, Lin Z H, Wang Z L. "Flexible Hybrid Energy Cell For Simultaneously Harvesting Thermal, Mechanical, And Solar Energie,". ACS Nano. 2012 Dec. 5, 7(1), pp. 785-90.

In view of the foregoing, it will be appreciated that there presently is significant interest in systems and/or methods which enable energy to be harvested. The successful harvesting of energy could be used for a wide variety of beneficial purposes, for example to power sensors, photovoltaic cells, and other electronic components. However, the complexity and drawbacks of present day systems makes many present day systems either too expensive or too inefficient for many energy harvesting applications.

SUMMARY

This section provides a general summary of the disclosure, and is not a comprehensive disclosure of its full scope or all of its features.

Features and advantages of the disclosed apparatus, systems, and methods will become apparent from the following description. The inventors are providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

The inventors have developed apparatus, systems, and methods that use nanowires to harvest both mechanical and low-quality thermal energy. The inventors apparatus, systems, and methods have been demonstrated through the use of Zinc Oxide (ZnO) nanowires combined with the phase change material NiTi ("Nitinol"). The ZnO nanowires are dense and uniform, with a length of 10-50 um, diameter of 200 nm, and a growth direction along the c-axis. The same growth direction of the nanowires guarantees the alignment of the piezoelectric potentials of all of the nanowires.

The apparatus, systems, and methods described herein have use in providing power generation harvested from low quality waste heat and external motion. The apparatus, systems, and methods described herein also have use in their ability to power small sensors and actuators devices requiring microwatts of power, or infrequent power from energy stored in a supercapacitor.

In one aspect the present disclosure relates to a system for harvesting at least one of mechanical or thermal energy. The system may comprise a flexible substrate, a plurality of electrically conductive nanowires secured to the flexible substrate, and a plurality of electrically conductive metal layers. The plurality of electrically conductive metal layers may be disposed on the flexible substrate and spaced apart from one another along a length of the flexible substrate. The plurality of electrically conductive metal layers may be in electrically conductive contact with various ones of the plurality of nanowires. At least two of the plurality of electrically conductive metal layers may be attachable to an external device. At least one of movement or flexing of the flexible substrate results in an output voltage across the plurality of electrically conductive metal layers.

In another aspect the present disclosure relates to an energy harvesting apparatus which may comprise a flexible substrate, a plurality of electrically conductive nanowires secured to the flexible substrate, and a plurality of electrically conductive metal layers. The electrically conductive metal layers may be disposed on the flexible substrate and may be in electrically conductive contact with various ones of the plurality of nanowires. A phase change material may also be included. The flexible substrate may be secured to the phase change material. Movement of the phase change material results in an output voltage being generated across the electrically conductive metal layers.

In still another aspect the present disclosure relates to a system for harvesting at least one of mechanical or thermal energy. The system may comprise a flexible substrate and a plurality of electrically conductive nanowires. The plurality of electrically conductive nanowires may be secured to the flexible substrate so that the nanowires are generally parallel to one another and spaced out along a length of the flexible substrate. A plurality of electrically conductive metal layers may be disposed on the flexible substrate and spaced apart from one another along a length of the flexible substrate. The plurality of electrically conductive metal layers may further be arranged generally perpendicular to the nanowires and in electrically conductive contact with various ones of the plurality of nanowires to form a series circuit. At least two of the plurality of electrically conductive metal layers may be used to form electrodes which are attachable to an external device. At least one of movement or flexing of the flexible substrate results in an output voltage across the plurality of electrically conductive metal layers.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. The accompanying drawings, which are incorporated into and constitute a part of the specification, illustrate specific embodiments of the apparatus, systems, and methods and, together with the general description given above, and the detailed description of specific embodiments serves to explain the principles of the apparatus, systems, and methods.

In the drawings:

FIGS. 1 through 3 are photographs showing the nanowires used with various embodiments described herein in highly magnified form;

FIG. 4a is a simplified illustration of how the nanowires are transferred to a flexible substrate by a repeated scratching motion of the flexible substrate along a direction of movement generally perpendicular to an orientation of the nanowires;

FIGS. 4b and 4c show pictures of the nanowires under high magnification;

FIGS. 5-9 illustrate fabrication operations in forming a circuit which has the nanowires attached on a flexible substrate, and with a plurality of electrically conductive layers formed on the flexible substrate which are in contact with various ones of the nanowires;

FIG. 10 is a simplified representation of a circuit formed by the electrically conductive layers of material and the nanowires;

FIGS. 11 and 12 are photographs showing the nanowires in highly magnified form to illustrate the generally perpendicular arrangement of the nanowires to the electrically conductive material layers;

FIG. 13 is an illustration of a circuit in accordance with the present disclosure showing a direction of a tapping force which was applied to the circuit during testing of the circuit to determine an open circuit output voltage of the circuit in response to the motion created by the tapping force;

FIGS. 14-16 show different open circuit voltage waveforms indicating the different open circuit output voltages created by different tapping actions on the circuit;

Figures 17, 18, 19, 20, 21, 22:
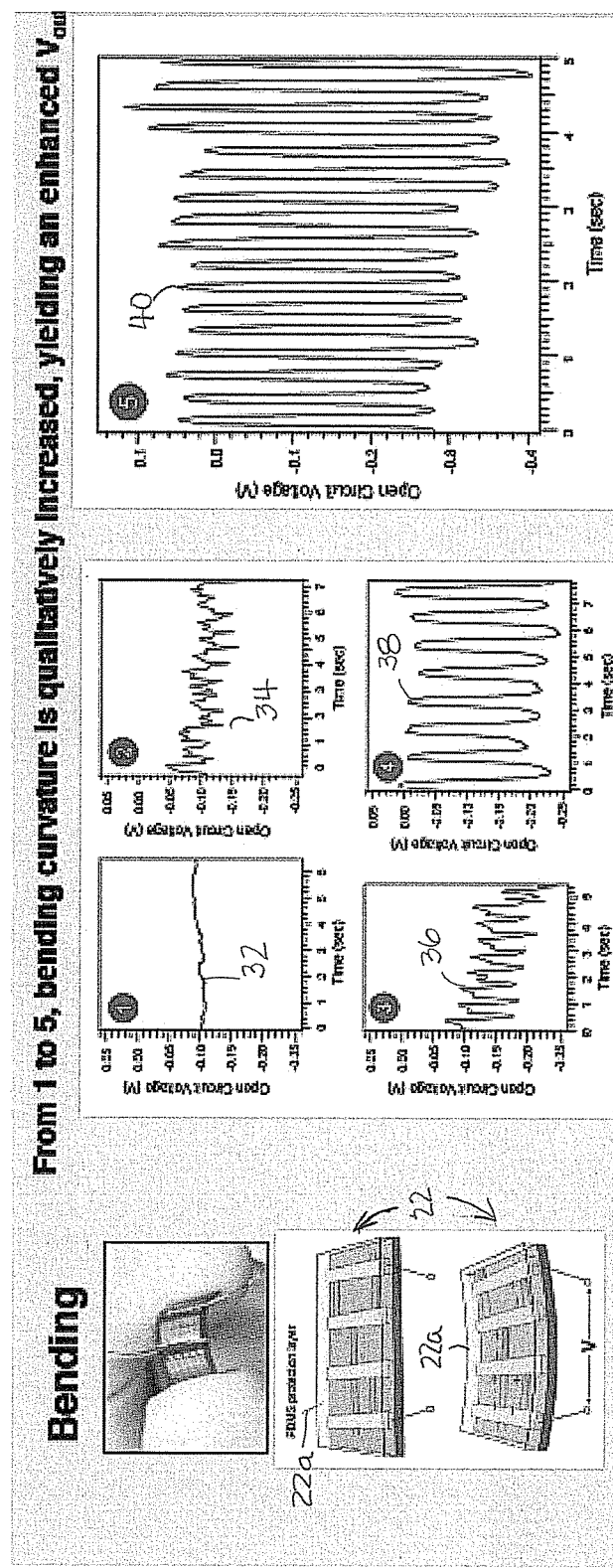
FIG. 17 shows a simplified representation of the circuit shown in FIG. 13 in a bent configuration.
FIGS. 18-22 illustrate various open circuit output voltage waveforms and show how the open circuit output voltage increases as the bending curvature is qualitatively increased.

FIG. 23 shows a circuit in accordance with the present disclosure secured to a phase change material, and where the phase change material has been deformed from an initial flat orientation to a bent orientation; and FIG. 24 shows an open circuit output voltage produced by the circuit of FIG. 23 as the phase change material changes shape and returns to its original flat shape in response to a temperature change.

Corresponding reference numerals indicate corresponding parts throughout the several views of the drawings.

DETAILED DESCRIPTION

Example embodiments will now be described more fully with reference to the accompanying drawings.

Referring to the drawings, to the following detailed description, and to incorporated materials, detailed information about the apparatus, systems, and methods is provided including the description of specific embodiments. The detailed description serves to explain the principles of the apparatus, systems, and methods described herein. The apparatus, systems, and methods described herein are susceptible to modifications and alternative forms. The application is not limited to the particular forms disclosed. The application covers all modifications, equivalents, and alternatives falling within the spirit and scope of the apparatus, systems, and methods as defined by the claims.

An important technical problem the co-inventors of the presently claimed subject matter have solved is the development of apparatus, systems, and methods to provide electrical power to small devices, wherein the electrical power is harvested from the ambient environment. This means turning waste energy, both thermal and mechanical, into useful electrical energy to power a wide variety of small electrical or electronic devices. The teachings of the present disclosure involve the use of nanowires as a new component to achieving an efficient, functioning energy harvesting device.

The co-inventors have demonstrated the feasibility of using nanowires to harvest both mechanical and low-quality thermal energy. This goal has been demonstrated through the use of Zinc Oxide (hereinafter "ZnO") nanowires combined with the phase change material NiTi (also known as "Nitinol", a shape memory alloy). As shown in FIGS. 1-3, ZnO nanowires 10 were grown using a conventional chemical vapor deposition process. The nanowires 10 produced by this process were dense and generally uniform in shape, and had a length of typically about 10-50 um, a diameter of typically between about 10 nm-500 nm, and more typically about 200 nm, and a growth direction along the c-axis (i.e., out of the paper as best shown in FIGS. 2 and 3). The same growth direction of the nanowires 10 advantageously guarantees the alignment of the piezoelectric potentials of all of the nanowires 10.

The nanowires 10 were transferred to a flexible polyimide film, for example a KAPTON® polyimide thin film 12, as shown in FIG. 4a, by gentle scratching. The scratching involves repeatedly moving the KAPTON® polyimide film 12 (i.e., the substrate) over the nanowires 10 in a direction generally parallel to a substrate 14 from which the nanowires 10 were grown. This causes removal of the nanowires 10 from the substrate from which they were grown. The nanowires 10 produced by this method are well-aligned (i.e., oriented substantially parallel to one another) on the receiving KAPTON® polyimide film 12, as shown in FIGS. 4b and 4c. Following dry-transfer, the KAPTON® polyimide film 12 may be evaporated, such as with a patterned gold electrode, using conventional microfabrication techniques as shown in FIGS. 5-9. Specifically, as shown in FIG. 6, a spin coat photoresist layer 16 is formed over the nanowires 10 and the KAPTON® polyimide film 12. In FIG. 7, using a photolithography process, portions of the photoresist material 16 are etched away to produce parallel channels 18 between alternating layers of the remaining photoresist material 16. In FIG. 8 a layer of electrically conductive material such as metal 20, for example gold, may be deposited (e.g., by sputtering or any other suitable technique) over the entire area of the KAPTON® polyimide film 12.

FIG. 9 illustrates a circuit 22 which is the result of the completed microfabrication process. The areas of the KAPTON® polyimide film 12 covered by the photoresist/metal 16/20 have been removed leaving the conductive metal 20 as generally parallel, spaced apart, conductive metal layers 20a along a length of the KAPTON® polyimide film 12. The circuit 22 is further illustrated in highly simplified schematic form in FIG. 10. In FIG. 10 it will be noted that the nanowires 10 are shown perfectly parallel to one another, and each nanowire 10 bridges two or more of the conductive metal layers 20a. However, in practice, as shown in FIG. 11, the nanowires 10 are not all perfectly parallel. Nevertheless, the nanowires 10 collectively form a series circuit comprised of long, generally parallel electrode arrays which are generally perpendicular to the nanowires 10. The series circuit 22 extends between electrode terminals 24a and 24b of the circuit 22, as shown in FIG. 10. FIG. 12 shows an actual picture of a portion of the circuit 22.

The excellent alignment of the nanowires 10 that the above fabrication method produces easily enables a scale-up of the output voltage from the circuit 22. The total output voltage is approximately the sum of the voltages across individual nanowires 10 in the vertical direction (i.e., along their lengths) because the nanowires are effectively connected in series as a result of their electrically conductive contact with the conductive metal layers 20a. The total output current and total output open circuit voltage scales up with the number of nanowires within each row of electrode pairs.

Mechanical harvesting was demonstrated using a periodic application of force, as shown in highly simplified form in FIG. 13. Tapping the circuit 22 from the top with a wood stick yielded an open circuit voltage (OCV) of about 0.2V-4.0V, depending on the tap stimulus, as illustrated by waveform 26 in FIG. 14. Pressing and holding the stimulus produced an oscillating, open circuit voltage waveform 28 as shown in FIG. 15. FIG. 16 shows an open circuit voltage 30 produced by tapping on different regions of the circuit 22. When the bending curvature of the circuit 22 is qualitatively increased, as shown in FIG. 17, this yields an enhanced voltage, as shown in waveforms 32, 34, 36, 38 and 40 of FIGS. 18-22, respectively. As shown in FIG. 17, the circuit 22 may also be covered with a suitable protection layer 22a, for example Polydimethylsiloxane ("PDMS").

Referring to FIG. 23, to demonstrate thermal harvesting from low quality heat sources, commercially available Nitinol (Ni—Ti alloy) thin film 42, a phase transition material with a transition temperature of 50° C., was attached to the circuit 22. In this manner the circuit 22 essentially acts as a piezoelectric device. The thin film 42 with the attached circuit 22 thereto was bent at room temperature. Upon heating above 50° C., the Nitinol thin film 42 returned to its original flat shape. Accordingly, the nanowire circuit 22 experienced a drastic shape change. This shape change yielded a peak-to-peak open circuit output voltage/power of about 0.65V, as indicated by waveform 44 in FIG. 24. Using $Gd_5Si_2Ge_2$ as the phase change material would be expected to provide an event greater peak-to-peak open circuit output voltage. A key feature of the circuit 22 is the near parallel nanowire 10 alignment reduces the internal resistance of the nanowires 10 and allows production of substantial usable power from the circuit 22.

The usable power produced by the circuit 22 is expected to be useful in a wide variety of applications where it is desirable to harvest energy from motion, vibration or changes in shape of an underlying substrate or device on which the circuit 22 is mounted. The output from the circuit 22 is expected to be particularly useful in powering low power sensors, motors, optoelectronics including cameras, solar cells, actuators, communications circuits, and a wide variety of other electrically powered devices.

The foregoing description of the various embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above described embodiments that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

What is claimed is:

1. A system for harvesting at least one of mechanical or thermal energy, the system comprising:
   a flexible substrate;
   a plurality of electrically conductive nanowires having differing, randomly varying lengths secured to the flexible substrate, generally parallel to one another, but randomly laterally offset from one another along both X and Y axes of the substrate;
   a plurality of electrically conductive metal layers disposed on the flexible substrate and spaced apart from one another along a length of the flexible substrate, the plurality of electrically conductive metal layers being in electrically conductive contact with differing subpluralities of the plurality of nanowires, and at least two of the plurality of electrically conductive metal layers being attachable to an external device; and
   wherein at least one of movement or flexing of the flexible substrate results in an output voltage across the plurality of electrically conductive metal layers.

2. The system of claim 1, wherein the nanowires are each comprised of Zinc oxide (ZnO) nanowires.

3. The system of claim 1, wherein the nanowires each have a diameter of between about 10 nm-500 nm.

4. The system of claim 3, wherein the nanowires each have a diameter of about 200 nm.

5. The system of claim 1, wherein the nanowires each have a length of between about 10 um to about 50 um.

6. The system of claim 1, wherein the flexible substrate comprises a polyimide film.

7. The system of claim 1, wherein the nanowires are aligned on the flexible substrate such that various ones of the plurality of nanowires are physically covered by two or more of the plurality of electrically conductive metal layers.

8. The system of claim 1, wherein the plurality of electrically conductive metal layers are arranged on the flexible substrate generally perpendicular to the nanowires.

9. The system of claim 1, wherein a pair of the plurality of electrically conductive metal layers at opposite ends of the flexible substrate form electrodes that facilitate a transfer of electrical power from the system to the external device.

10. The system of claim 1, further comprising a phase change material, and wherein the flexible substrate is secured to the phase change material.

11. The system of claim 10, wherein the phase change material comprises Nitinol.

12. The system of claim 1, wherein the flexible substrate and the plurality of electrically conductive metal layers are at least partially encapsulated in a protective material.

13. The system of claim 12, wherein the protective material comprises a layer of Polydimethylsiloxane ("PDMS").

14. The system of claim 1, wherein the system is formed using a microfabrication technique including operations involving spin coating, metal deposition and etching.

15. The system of claim 1, wherein the nanowires are secured to the flexible substrate by moving the flexible substrate over the nanowires, in a direction of movement which is perpendicular to an orientation of the nanowires, with a scratching motion that removes the nanowires from a separate substrate on which the nanowires have been grown.

16. An energy harvesting apparatus comprising:
   a flexible substrate;
   a plurality of electrically conductive nanowires having differing, randomly varying lengths, secured to the flexible substrate generally parallel to one another, but randomly laterally offset from one another along both of the X and Y axes of the substrate;
   a plurality of electrically conductive metal layers disposed on the flexible substrate and being in electrically conductive contact with differing subpluralities of the plurality of nanowires;
   a phase change material, the flexible substrate being secured to the phase change material; and
   wherein movement of the phase change material results in an output voltage being generated across the electrically conductive metal layers.

17. The apparatus of claim 16, wherein the nanowires comprise Zinc Oxide nanowires.

18. The apparatus of claim 16, wherein the phase change material comprises a Nickel Titanium alloy.

19. The apparatus of claim 16, wherein the plurality of electrically conductive metal layers are formed generally perpendicular to the nanowires such that at least some of the nanowires bridge two of more of the electrically conductive metal layers.

20. The apparatus of claim 16, wherein the flexible substrate comprises a polyimide.

21. A system for harvesting at least one of mechanical or thermal energy, the system comprising:
   a flexible substrate;
   a plurality of electrically conductive nanowires of randomly varying lengths secured to the flexible substrate so that the nanowires are generally parallel to one another and spaced out laterally, randomly along both X and Y axes of the flexible substrate;
   a plurality of electrically conductive metal layers disposed on the flexible substrate and spaced apart from one another along a length of the flexible substrate, the plurality of electrically conductive metal layers being arranged generally perpendicular to the nanowires and in electrically conductive contact with differing subpluralities of the nanowires to form a series circuit, and at least two of the plurality of electrically conductive metal layers forming electrodes attachable to an external device; and
   wherein at least one of movement or flexing of the flexible substrate results in an output voltage across the plurality of electrically conductive metal layers.

* * * * *